(12) United States Patent
Strader

(10) Patent No.: US 9,781,819 B2
(45) Date of Patent: Oct. 3, 2017

(54) MULTIFUNCTIONAL COMPONENTS FOR ELECTRONIC DEVICES AND RELATED METHODS OF PROVIDING THERMAL MANAGEMENT AND BOARD LEVEL SHIELDING

(71) Applicant: Laird Technologies, Inc., Earth City, MO (US)

(72) Inventor: Jason L. Strader, Cleveland, OH (US)

(73) Assignee: Laird Technologies, Inc., Earth City, MO (US)

( * ) Notice: Subject to any disclaimer, the term of this patent is extended or adjusted under 35 U.S.C. 154(b) by 0 days.

(21) Appl. No.: 15/072,264

(22) Filed: Mar. 16, 2016

(65) Prior Publication Data

US 2017/0034900 A1 Feb. 2, 2017

Related U.S. Application Data

(60) Provisional application No. 62/199,384, filed on Jul. 31, 2015, provisional application No. 62/251,406, filed on Nov. 5, 2015.

(51) Int. Cl.
*H05K 1/00* (2006.01)
*H05K 1/02* (2006.01)
(Continued)

(52) U.S. Cl.
CPC ........... *H05K 1/0203* (2013.01); *H01L 23/40* (2013.01); *H05K 7/20436* (2013.01); *H05K 9/0032* (2013.01)

(58) Field of Classification Search
CPC ... H05K 1/00; H05K 1/02; H05K 1/11; H05K 1/14; H05K 3/02; H05K 3/10; H05K 3/28;
(Continued)

(56) References Cited

U.S. PATENT DOCUMENTS 4,837,664 A * 6/1989 Rodriguez, II .... H05K 7/20545
165/185
4,974,317 A * 12/1990 Rodriguez, II ...... H05K 7/1461
174/250

(Continued)

FOREIGN PATENT DOCUMENTS

JP 2004207661 A 7/2004

OTHER PUBLICATIONS

International Search Report and Written Opinion for PCT Application No. PCT/US2016/041074 filed Jul. 6, 2016 which claims priority to the instant application, dated Oct. 14, 2016, 12 pages.

*Primary Examiner* — Xiaoliang Chen
(74) *Attorney, Agent, or Firm* — Harness, Dickey & Pierce, P.L.C.

(57) ABSTRACT

Exemplary embodiments are disclosed of multifunctional components for electronic devices. In an exemplary embodiment, a multifunctional component generally includes a base component, such as a smart phone case (e.g., a back cover, etc.), an inner plate (e.g., a screenplate, a mid-plate, etc.). A heat spreader may be disposed on the base component. Thermal interface material and electromagnetic interference shielding may be disposed on area(s) of the heat spreader. The area(s) may correspond in mirror image relation to component(s) of a circuit board with which the multifunctional component is configured to be joined. During operation of the electronic device, the multifunctional component may draw waste heat from one area and transfer/spread the waste heat to one or more other areas of the electronic device, which may increase a temperature of these one or more other areas. This, in turn, may make device temperature more uniform.

15 Claims, 2 Drawing Sheets

(51) Int. Cl.
  *H01L 23/40* (2006.01)
  *H05K 7/20* (2006.01)
  *H05K 9/00* (2006.01)

(58) Field of Classification Search
  CPC .. H05K 3/30; H05K 7/14; H05K 7/18; H05K 7/20; H05K 9/00; H05K 9/32; H01L 21/02; H01L 21/44; H01L 21/48; H01L 21/50; H01L 23/00; H01L 23/02; H01L 23/34; H01L 23/36
  USPC ....... 174/252, 254, 260, 262, 370, 377, 384; 361/679.46, 679.54, 690, 704, 709, 361/714–716, 719, 816; 257/679, 717, 257/737, 738; 220/4.21
  See application file for complete search history.

(56) References Cited

U.S. PATENT DOCUMENTS

| | | | |
|---|---|---|---|
| 5,520,976 A * | 5/1996 | Giannetti | H05K 7/1418 174/384 |
| 5,700,342 A * | 12/1997 | Giannetti | H05K 7/1418 156/245 |
| 5,703,753 A * | 12/1997 | Mok | H01L 23/4006 174/16.3 |
| 5,777,846 A * | 7/1998 | Hayes | H05K 7/20545 361/690 |
| 6,018,460 A * | 1/2000 | Borowiec | H01L 23/3672 165/185 |
| 6,037,659 A * | 3/2000 | Weixel | H01L 23/433 257/706 |
| 6,180,045 B1 * | 1/2001 | Brandenburg | H05K 3/0061 264/263 |
| 6,352,103 B1 * | 3/2002 | Chu | F28D 15/0233 165/104.33 |
| 6,357,414 B1 * | 3/2002 | Kalinowski | F02D 9/02 123/198 E |
| 6,409,859 B1 * | 6/2002 | Chung | B32B 7/12 156/250 |
| 6,542,371 B1 * | 4/2003 | Webb | H01L 23/3733 165/185 |
| 6,705,388 B1 * | 3/2004 | Sorgo | H01L 23/3731 165/185 |
| 6,965,071 B2 * | 11/2005 | Watchko | C23C 4/00 174/377 |
| 7,262,369 B1 * | 8/2007 | English | H01L 23/04 174/370 |
| 7,957,131 B1 * | 6/2011 | Mongia | H05K 7/20427 361/679.46 |
| 7,969,748 B2 * | 6/2011 | Niederkorn | H04B 1/3833 361/756 |
| 9,006,889 B2 * | 4/2015 | Joshi | H01L 23/49811 257/675 |
| 9,059,127 B1 * | 6/2015 | Lamorey | H01L 23/5226 |
| 9,254,588 B1 * | 2/2016 | Chao | H05K 3/284 |
| 2001/0019477 A1 * | 9/2001 | Murasawa | H05K 9/0037 361/816 |
| 2002/0162672 A1 * | 11/2002 | Cook | H05K 9/009 174/391 |
| 2002/0162673 A1 * | 11/2002 | Cook | H05K 7/20872 174/391 |
| 2004/0212964 A1 * | 10/2004 | Belady | H01L 23/36 361/704 |
| 2004/0214496 A1 * | 10/2004 | Yang | H05K 9/0086 442/301 |
| 2005/0073816 A1 * | 4/2005 | Hill | H01L 23/4275 361/708 |
| 2005/0111194 A1 * | 5/2005 | Sohn | H01L 23/3672 361/704 |
| 2005/0112796 A1 * | 5/2005 | Ararao | H01L 21/4878 438/106 |
| 2005/0141209 A1 * | 6/2005 | Chen | H05K 9/0039 361/800 |
| 2006/0091542 A1 * | 5/2006 | Zhao | H01L 21/565 257/738 |
| 2006/0198108 A1 * | 9/2006 | Refai-Ahmed | H05K 1/0203 361/719 |
| 2006/0255440 A1 * | 11/2006 | Miyazaki | H01L 23/49822 257/679 |
| 2007/0053168 A1 * | 3/2007 | Sayir | B32B 18/00 361/718 |
| 2007/0086170 A1 * | 4/2007 | Liang | H01L 23/367 361/719 |
| 2007/0210082 A1 * | 9/2007 | English | H05K 9/0032 220/4.21 |
| 2007/0211436 A1 * | 9/2007 | Robinson | H01L 23/552 361/719 |
| 2007/0211445 A1 * | 9/2007 | Robinson | H01L 23/552 361/818 |
| 2007/0228109 A1 * | 10/2007 | Smith | B23K 35/262 228/176 |
| 2008/0151503 A1 * | 6/2008 | Aapro | H04M 1/026 361/714 |
| 2008/0277151 A1 * | 11/2008 | Fjelstad | H05K 1/185 174/260 |
| 2008/0297985 A1 * | 12/2008 | Fjelstad | H05K 1/144 361/600 |
| 2008/0310114 A1 * | 12/2008 | Pawlenko | H05K 7/20454 361/704 |
| 2009/0008140 A1 * | 1/2009 | Fjelstad | H05K 1/189 174/260 |
| 2009/0027859 A1 * | 1/2009 | Giacoma | H01L 21/50 361/709 |
| 2010/0096166 A1 * | 4/2010 | Fjelstad | H05K 3/32 174/254 |
| 2010/0142153 A1 * | 6/2010 | Ho | H01L 23/3677 361/710 |
| 2010/0142155 A1 * | 6/2010 | Mertol | H01L 23/055 361/719 |
| 2010/0237477 A1 * | 9/2010 | Pagaila | H01L 21/561 257/660 |
| 2010/0321897 A1 * | 12/2010 | Hill | B29C 66/304 361/720 |
| 2011/0063265 A1 | 3/2011 | Kim | |
| 2011/0085316 A1 * | 4/2011 | Myers | H05K 3/284 361/818 |
| 2011/0127080 A1 * | 6/2011 | Fjelstad | H05K 1/144 174/262 |
| 2011/0176279 A1 * | 7/2011 | Zhao | H01L 21/4878 361/720 |
| 2012/0049347 A1 * | 3/2012 | Wang | H01L 21/563 257/737 |
| 2012/0061135 A1 * | 3/2012 | Hill | H05K 9/009 174/388 |
| 2012/0094442 A1 * | 4/2012 | Lin | H05K 1/021 438/118 |
| 2013/0077282 A1 | 3/2013 | Malek et al. | |
| 2013/0265722 A1 * | 10/2013 | Hill | G06F 1/203 361/707 |
| 2014/0048326 A1 * | 2/2014 | Lin | H05K 9/00 174/377 |
| 2014/0055957 A1 | 2/2014 | Yang et al. | |
| 2014/0182924 A1 * | 7/2014 | Misra | H05K 7/20454 174/377 |
| 2014/0252568 A1 * | 9/2014 | Hwang | H01L 23/552 257/659 |
| 2014/0262161 A1 * | 9/2014 | Weigand | G06F 1/203 165/104.33 |
| 2015/0043161 A1 * | 2/2015 | Nelson | G06F 1/206 361/679.54 |
| 2015/0092363 A1 * | 4/2015 | Blier | H05K 1/189 361/749 |
| 2015/0201533 A1 * | 7/2015 | Daughtry, Jr. | H05K 9/0028 174/377 |
| 2015/0282392 A1 * | 10/2015 | Liu | H05K 9/0024 361/707 |
| 2015/0301568 A1 * | 10/2015 | Hill | H05K 7/20445 361/714 |

(56) References Cited

U.S. PATENT DOCUMENTS

| | | | |
|---|---|---|---|
| 2015/0303562 A1* | 10/2015 | Chen | H01Q 1/526 |
| | | | 174/350 |
| 2015/0382448 A1* | 12/2015 | Pennathur | H05K 1/0203 |
| | | | 361/679.54 |
| 2016/0013527 A1* | 1/2016 | Rich | H01M 10/623 |
| | | | 429/96 |
| 2016/0095266 A1* | 3/2016 | Liu | H05K 9/0032 |
| | | | 174/384 |
| 2016/0242321 A1* | 8/2016 | Van Haaster | H05K 7/20509 |
| 2016/0293554 A1* | 10/2016 | Tan | H01L 23/5385 |

\* cited by examiner

MULTIFUNCTIONAL COMPONENTS FOR ELECTRONIC DEVICES AND RELATED METHODS OF PROVIDING THERMAL MANAGEMENT AND BOARD LEVEL SHIELDING

CROSS-REFERENCE TO RELATED APPLICATIONS

This patent application claims the benefit of and priority to U.S. Provisional Patent Application No. 62/199,384 filed Jul. 31, 2015 and U.S. Provisional Patent Application No. 62/251,406 filed Nov. 5, 2015. The entire disclosures of the above applications are incorporated herein by reference.

FIELD

The present disclosure generally relates to multifunctional components for electronic devices, such as a smart phone case (e.g., a back cover, etc.), an inner plate (e.g., a screenplate, a mid-plate, etc.) and related methods of providing thermal management and board level shielding.

BACKGROUND

This section provides background information related to the present disclosure which is not necessarily prior art.

Electrical components, such as semiconductors, transistors, etc., typically have pre-designed temperatures at which the electrical components optimally operate. Ideally, the pre-designed temperatures approximate the temperature of the surrounding air. But the operation of electrical components generates heat which, if not removed, will cause the electrical component to operate at temperatures significantly higher than its normal or desirable operating temperature. Such excessive temperatures may adversely affect the operating characteristics of the electrical component and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition to generating heat, the operation of electronic devices generates electromagnetic radiation within the electronic circuitry of the equipment. Such radiation may result in electromagnetic interference (EMI) or radio frequency interference (RFI), which can interfere with the operation of other electronic devices within a particular proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

DETAILED DESCRIPTION

Figures 1, 2:
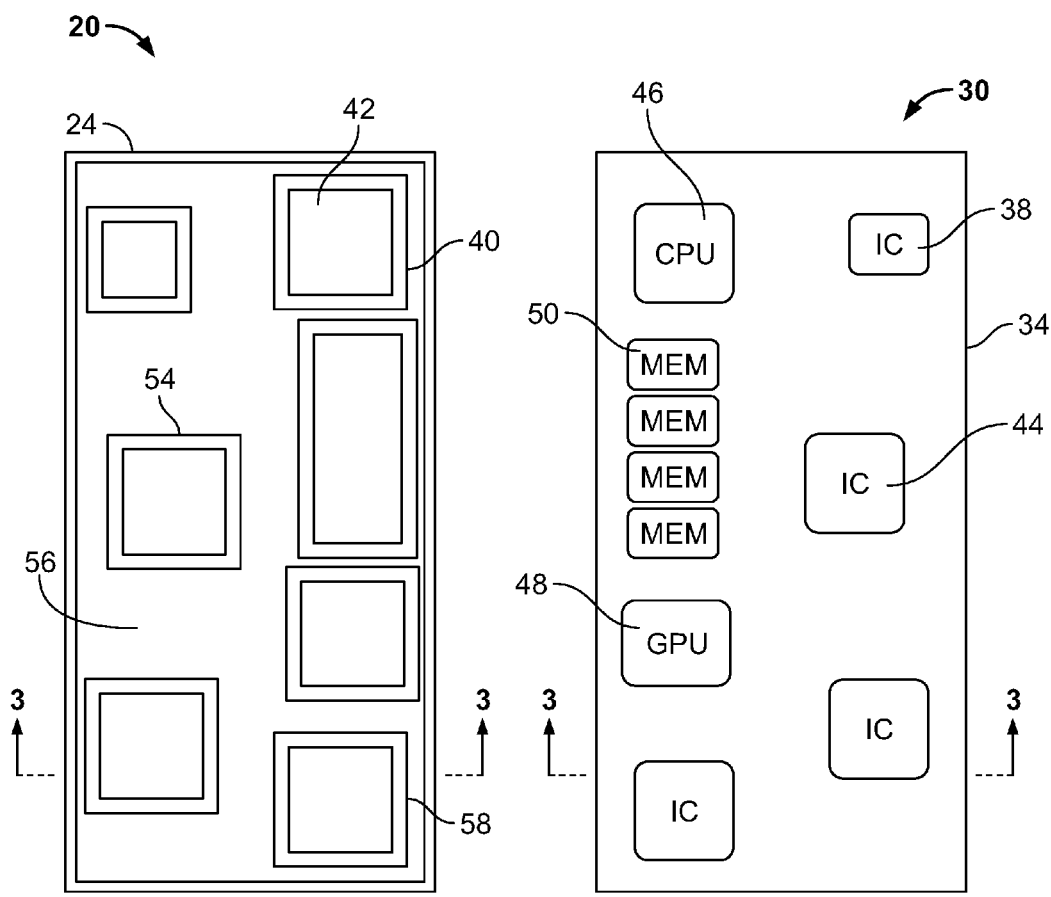
FIG. 1 illustrates a multifunctional component of an electronic device that may be used for providing EMI shielding and thermal management for a circuit board of the electronic device according to an exemplary embodiment.
FIG. 2 illustrates a circuit board for which the multifunctional component shown in FIG. 1 may be used to provide EMI shielding and thermal management according to an exemplary embodiment.

Example embodiments will now be described more fully with reference to the accompanying drawings.

Smartphone thickness continues to decrease with each successive generation such that smartphone manufacturers continue to seek opportunities to reduce thickness while retaining or expanding on functionality. Although circuit boards in smart phones and other electronic devices frequently have on-board components for providing EMI shielding and thermal management, the inventor hereof has recognized that another component of the smart phone (or other electronic device) may be configured with additional functionality so as to provide EMI shielding and/or thermal management to the circuit board.

Accordingly, in various exemplary embodiments of the disclosure, EMI shielding and/or thermal interface material (TIM) may be disposed, e.g., installed, deposited, etc., on a device component such as a smart phone case or housing (e.g., back cover, etc.), inner plate (e.g., screenplate, mid-plate, etc.), etc. so that the device component is multifunctional and/or complementary to a circuit board. For example, the device component may retain its original functionality but also have additional functionality for providing EMI shielding and/or thermal management for the circuit board. The device component may also be referred to herein as a "multifunctional component" and/or a "complementary component".

The multifunctional components disclosed herein may be provided for flexible and/or rigid circuit boards. In various embodiments, a multifunctional component includes a heat spreader upon which TIM and/or EMI shielding are installed. A multifunctional component may be joined, e.g., laminated, together with a circuit board, e.g., to provide EMI shielding and/or thermal management for circuit components on the circuit board. Thus, an example multifunctional or complementary component may be multifunctional, by serving, e.g., as a case, inner plate (e.g., mid-plate, screenplate, etc.), or other component, and also by providing board level shielding and/or thermal management.

By way of example, an exemplary embodiment includes a case or an inner plate (e.g., a mid-plate, a screenplate, etc.). A heat spreader (e.g., a graphite sheet, etc.) is attached (e.g., laminated, etc.) to the case or inner plate. For EMI management, board level shielding (BLS) is attached to the case or inner plate at locations corresponding to locations on a printed circuit board (PCB) at which components to be shielded are located. For thermal management, thermal interface material (TIM) is attached to the case or inner plate (e.g., attached to the BLS, attached directly to the case or inner plate, attached to the heat spreader, etc.). This enables the ability to spread heat from one PCB component to another PCB component and/or to an unused portion of the board, etc. The other PCB component and/or unused portion of the PCB may then be used as a heat sink or transient heat sink if needed. In this example, heat may be transferred from one or more hotter PCB components (e.g., power amplifier module (PAM), application processing unit (APU), etc.) to one or more other cooler PCB portions, PCB components, or electronic device components (e.g., memory, unused portion of the board, battery, etc.). By considering a device as a whole for thermal management purposes instead of treating each individual components separately and transferring heat on a single component basis, exemplary embodiments may allow for more uniform device temperature and improved device thermal properties even though individual ones of the components may be heated by transferring heat from other components. Accordingly, exemplary embodiments may include using other parts of an electronic device as heat sinks such that heat is transferred from one component(s) to another component(s). For example, an inner plate of an electronic device may be used to provide thermal management. The inner plate may draw waste heat from one or more areas and transfer/spread the waste heat to one or more other areas, which may heat and increase the temperature of these one or more other areas of the electronic device. This, in turn, may make device temperature more uniform and allow heat to be dissipated more uniformly.

In some exemplary embodiments, thermal heat transfer may also be tailored by using different TIMs having different thermal conductivities to avoid component overheating. For example, a case, an inner plate, or other component may be provided with a first TIM having a relatively high thermal conductivity (e.g., at least 8 Watts per meter per Kelvin (W/mK), etc.) for transferring heat to the board itself, and a second TIM having a lower thermal conductivity (e.g., 2 W/mK, etc.) for heat transfer with a PCB component that might be more susceptible to overheating. In this exemplary manner, more heat may preferably be transferred to the board itself than to the PCB component.

In exemplary embodiments, heat may also be transferred to/from a battery of the electronic device. In other exemplary embodiments, a heat spreader may be configured to avoid the battery area.

In exemplary embodiments, heat may be transferred to/from multiple device components (e.g., power amplifier module (PAM), application processing unit (APU), memory, battery, integrated circuit (IC), touchscreen processor, wireless power charging, communication bridge, graphics processing unit (GPU), central processing unit (CPU), accelerometer, transceiver, receiver, etc.). Also in exemplary embodiments, multiple components of an electronic device may be configured with additional functionality. For example, an exemplary embodiment may include both a case (e.g., a back cover, etc.) and an inner plate (e.g., a screenplate, etc.) that are provided with BLS, TIM, and heat spreaders. The inner plate with the heat spreader may be operable for transferring or spreading heat from one area (e.g., device component, board, etc.) to other areas to thereby make device temperature more uniform and allow heat to be dissipated more uniformly. For transferring heat to unused portions of the PCB that do not include any components thereon, the inner plate may be provided with the TIM but not any BLS at locations corresponding to the unused portions of the PCB.

Referring to the figures, FIG. 1 illustrates an example multifunctional and/or complementary component 20 configured for inclusion in an electronic device, such as a smart phone, etc. The multifunctional component 20 includes a base component 24, e.g., a case (e.g., back cover, etc.), an inner plate (e.g., a mid-plate, a screenplate, etc.), etc. for a smart phone or other electronic device. FIG. 2 illustrates an example circuit board 30 configured for inclusion in an electronic device, such as a smart phone, etc. The circuit board 30 includes a board 34 (broadly, substrate) and a plurality of electronic components 38 on the substrate 34. The multifunctional component 20 includes EMI shielding 40 and TIM 42 to provide shielding and thermal management for the electronic components 38 of the circuit board 30 when the multifunctional component 20 and the circuit board 30 are joined together and installed in an electronic device.

The substrate 34 of the circuit board 30 may be flexible. The electronic components 38 of the example circuit board 30 include, e.g., a plurality of integrated circuits (ICs) 44, a central processing unit (CPU) 46, a graphics processing unit (GPU) 48, and a plurality of memory units 50. In various embodiments, other or additional types and/or numbers of electronic components could be provided on a circuit board and could be provided with EMI shielding and/or thermal management by a multifunctional component of an electronic device.

Figure 3:
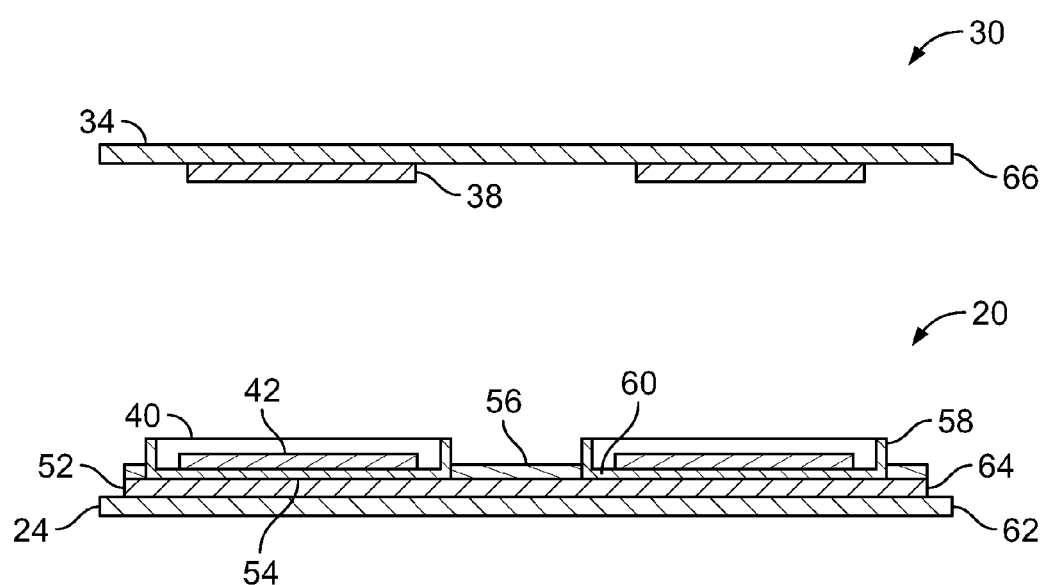
FIG. 3 is an exploded sectional view of the multifunctional component of FIG. 1 positioned in mirror relation to the circuit board of FIG. 2, the view taken across lines 3-3 of FIGS. 1 and 2.

As shown in FIG. 3, the multifunctional component 20 includes a heat spreader 52 disposed on (e.g., laminated onto, etc.) the base component 24. In the present example embodiment, the heat spreader 52 may be a sheet of graphite. Alternatively, other suitable heat spreaders may be used in other exemplary embodiments.

Areas 54 (e.g., sections, parts, portions, etc.) of the heat spreader 52 correspond in mirror image relation to the electronic components 38 of the circuit board 30. Accordingly, when the complementary component 20 is joined with the circuit board 30, the EMI shielding 40 and/or TIM 42 provided in and/or on a given area 54 provide shielding and/or thermal management for a corresponding circuit board component 38.

In various embodiments, dielectric (e.g., a dielectric coating, dielectric film, electrical insulation, etc.) is provided, e.g., along and/or over portions of the heat spreader 52. In the example shown in FIG. 3, a dielectric layer 56 is disposed (e.g., printed, laminated, coated, etc.) on the heat spreader 52, e.g., in a pattern so as to leave the areas 54 exposed on the heat spreader 52 for EMI shielding 40.

For example, EMI shielding 40 provided in a given area 54 on the heat spreader 52 may include sidewalls 58 that extend from (e.g., are removably attached to, fixedly attached to, integrally connected with, etc.) a cover 60. The cover 60 may be attached to the heat spreader 52. In some other embodiments, a cover may not be provided in some or all areas 54. In which case, the sidewalls 58 may be coupled directly to the heat spreader 52, dielectric layer 56, and/or a TIM, and the heat spreader 52, TIM, and/or base component 24 may be operable as a cover for the sidewalls 58. For example, a plurality of EMI shielding walls 58 may be attached to the heat spreader 52 without any cover 60, such that the heat spreader 52 may then be operable or function as a lid for the plurality of EMI shielding walls 58.

The EMI shielding 40 is made of metal or other EMI shielding material. The EMI shielding 40 may be disposed in exposed area(s) 54, e.g., in contact with the heat spreader 52 and for electrical connection with ground, e.g., through the heat spreader 52. In the example, thermal interface material (TIM) 42 is provided on cover(s) 60 such that the TIM 42 will compressively contact a corresponding one of the electronic components 38 when the multifunctional component 20 and the circuit board 30 are joined together and installed in an electronic device.

In various embodiments, thermal interface material (TIM) 42 may be provided directly on one or more exposed area(s) 54 of the heat spreader 52, for example, in an area 54, or part of an area 54, in which no shielding cover 60 is provided. Additionally or alternatively, TIM may be provided between a cover 60 and the heat spreader 52. In various embodiments, EMI shielding and/or TIM may be provided in different configurations in different areas of a heat spreader, dependent, e.g., on corresponding circuit board component types and/or characteristics.

For example, TIM may also or instead be positioned on the dielectric layer 56 without any EMI shielding such that the TIM will make compressive contact against an unused portion of the board 34 itself when the multifunctional component 20 and the circuit board 30 are joined together and installed in an electronic device. In this example, the TIM may have a thermal conductivity (e.g., at least 8 W/mK, etc.) for transferring heat to the board 34, where the thermal conductivity is higher than the TIM 42 on the cover 60. In this exemplary manner, more heat may preferably be transferred to the board 34 itself via the TIM having the high thermal conductivity as compared to heat transferred to the electronic component 38 by the TIM 42.

In the present example embodiment, edges 62 of the base component 24 extend beyond edges 64 of the heat spreader 52 and dielectric layer 56 and are coextensive with edges 66 of the circuit board 30. In various embodiments, a multifunctional and/or complementary component may be provided with sidewalls and/or other types of edges dependent, e.g., on size and/or contours of the multifunctional component, size and/or contours of a circuit board to be joined with the multifunctional component, method(s) for joining the circuit board with the multifunctional component, whether additional components would be used in joining the multifunctional component and the circuit board, etc. In various embodiments, a circuit board may be sandwiched between a multifunctional and/or complementary component and another plate, cover, or other component. In some embodiments, edges of a base component could be coextensive with edges of a heat spreader on the base component. It should also be understood that thicknesses, proportions, sizes, contours, shapes, extents, etc. of various heat spreaders, dielectric layers, TIM, EMI shielding material, etc. may vary in different embodiments.

The heat spreader areas 54 are configured to allow heat to spread from a given area 54 and corresponding circuit board electronic component 38, e.g., through the heat spreader 52, to other area(s) 54 and other circuit board electronic component(s) 38. Thus, in various embodiments, electronic component(s) 38 on the circuit board 30 and/or other parts or portions of the electronic device (e.g., battery, etc.) may be used as heat sink(s) (e.g., as a transient heat sink, etc.). For example, the multifunctional component 20 may allow heat to be transferred from an integrated circuit (IC) 44, a central processing unit (CPU) 46, and/or a graphics processing unit (GPU) 48 to a memory unit(s) 50. This heat transfer may increase the temperature of the memory unit(s) 50, which, in turn, may make the device temperature more uniform and allow heat to be dissipated more uniformly.

In various embodiments, solder reflow of the EMI shielding 40 to the circuit board 30 may be eliminated as the EMI shielding 40 may instead contact grounding pad(s) or other grounding device(s) by a compressive or spring force created when the multifunctional component 20 and the circuit board 30 are joined together and installed in an electronic device. Eliminating the need for solder results in a lighter weight device.

By way of example, the EMI shielding 40 may be made, e.g., of flexible electrically-conductive fabric capable of providing desired shielding properties in some exemplary embodiments. Such embodiments can be lighter in weight than comparable devices in which non-fabric inflexible shielding is used. In various embodiments in which a circuit board is to be sandwiched between a multifunctional and/or complementary component and another plate, cover, or other device component, performance of the "sandwiching" assembly process may result in electrical and/or thermal contact between the multifunctional and/or complementary component and the circuit board. In some embodiments, waxes, low-temperature melting alloys, other heat absorbing materials, etc. may be included to absorb heat for transient operations. Additionally or alternatively, thin heat pipe(s) may be included in exemplary embodiments in which sufficient space is provided for inclusion of heat pipe(s).

In various embodiments, a multifunctional and/or complementary component may provide one or more heat paths within a smartphone or other electronic device. For example, at least a portion of the base component 24 may be thermally conductive. In such a case, the base component 24 and the heat spreader 52 may be used to establish or define at least a portion of one or more heat paths within the smartphone or other electronic device from one or more heat sources (e.g., circuit board-mounted heat generating electronic component(s) 38, etc.) to one or more other parts or portions of the smartphone (e.g., board 34, other circuit board-mounted heat generating electronic component(s) 38, etc.). In various embodiments, heat may be transferred not only to one or more heat spreader areas and corresponding electronic components, but also to one or more additional heat dissipating and/or heat removal structures (e.g., a heat sink, an exterior case or housing of a smartphone, heat spreader, heat pipe, etc.).

In some embodiments, and referring to FIGS. 1-3, EMI shielding sidewall(s) 58 and/or cover(s) 60 may be installed in heat spreader area(s) 54 in which corresponding electronic component(s) 38 are to be positioned when the multifunctional component 20 is joined with the circuit board 30. One or more sidewalls 58 and/or covers 60 may be attached to a heat spreader area 54 e.g., by being pressed against and adhesively attached to (e.g., electrically-conductive pressure sensitive adhesive (PSA), etc.) the surface of the heat spreader 52 that is exposed in the area 54, etc.

When the multifunctional component 20 is joined with the circuit board 30, EMI shielding sidewalls 58 are positioned generally about a corresponding electronic component 38 on the circuit board 30 such that the electronic component 38 is within an interior or shielding enclosure cooperatively defined by the sidewalls 58 and the cover 60. It should be noted that embodiments are possible in which more than one electronic component 38 on a circuit board corresponds to the same heat spreader area 54. For example, a single heat spreader area 54 could be sized and/or configured with EMI shielding 40 and TIM 42 so as to receive two circuit board electronic components 38. Thus, EMI shielding 40 and/or TIM 42, e.g., could be provided to shield and/or provide thermal management for both components 38 together, each component 38 individually, portions of one or both components 38, etc.

In exemplary embodiments, EMI shielding for a given electronic component may include a cover and one or more sidewalls. The one or more sidewalls may comprise a single sidewall, may comprise a plurality of sidewalls that are separate or discrete from each other, or may comprise a plurality of sidewalls that are integral parts of a single-piece EMI shield, etc. In exemplary embodiments, an EMI shielding cover and one or more sidewalls may be integrally formed from a single piece of electrically-conductive material so as to have a monolithic construction. The cover may be integrally formed with the sidewalls such that the sidewalls extend away from the cover. In other exemplary embodiments, an EMI shielding cover may be made separately and not integrally with sidewalls.

In various embodiments, EMI shielding may include one or more internal walls, dividers, or partitions that are attached to a heat spreader of a multifunctional and/or complementary component. For example, an internal wall may be provided in a heat spreader area to improve EMI isolation, as an internal wall could cooperate, e.g., with an EMI shielding cover and sidewalls to define two individual EMI shielding compartments. When such a multifunctional and/or complementary component is joined with a circuit board, electronic components on the circuit board may be positioned in different compartments such that the components are provided with EMI shielding by virtue of the EMI shielding compartments inhibiting the ingress and/or egress of EMI into and/or out of each EMI shielding compartment. In other exemplary embodiments, an EMI shield may not include or may be free of interior walls, dividers, or partitions such that any sidewalls and/or cover of the EMI shield generally define a single interior space or compartment.

The dielectric layer 56 (e.g., dielectric coating, dielectric film, electrical insulation, etc.) may be applied to the heat spreader 52, e.g., via spray coating, ink jet printing, a print nozzle, brushing, screen printing, pad printing, stencil printing, roller coating, other suitable process, etc. The dielectric layer 56 may electrically isolate the heat spreader 52 (e.g., graphite, etc.) from other components (e.g., logic boards, electronic components, battery, etc.) of the smartphone or other device. The dielectric layer 56 may act as an intermediary between electronic components 38 and the heat spreader 52 to prevent direct contact between the electronic components and the heat spreader 52. The dielectric layer 56 may inhibit or prevent the heat spreader 52 from electrically shorting components 38 of the smartphone or other device.

The dielectric layer 56 may also encapsulate or coat the heat spreader 52, e.g., to inhibit flaking and migration of the graphite when the heat spreader 52 is made of graphite. In some embodiments, the dielectric layer 56 may be cured with ultraviolet light. In an exemplary embodiment, the dielectric layer 56 may provide greater electrical resistance (e.g., electrical resistance greater than 4 gigaohms at 1000 volts with a 1 mm probe tip diameter and 100 gram weight, etc.) than the heat spreader 52. The dielectric layer 56 may include, e.g., a blend of polymers, with acrylate polymers as the primary component, along with other components such as urethane, polyester and polyvinyl polymers, photo initiators, and other additives, etc. A dielectric layer may be disposed only along portion(s) of an outward-facing exposed surface of a heat spreader in some embodiments. In other embodiments, a dielectric layer may be disposed along portion(s) of a base component, TIM, and/or EMI shielding in addition to outward-facing exposed surface portions(s) of a heat spreader.

In some embodiments, the dielectric layer 56 may include one or more fillers and/or additives to achieve various desired outcomes. For example, the dielectric layer 56 may include thermally conductive filler such that the dielectric layer 56 is also thermally conductive and operable as a thermal interface material. Examples of other fillers that may be added include pigments, plasticizers, process aids, flame retardants, extenders, tackifying agents, etc. The dielectric layer 56 may comprise a dielectric, thermally conductive thermal interface material.

In various embodiments, a heat spreader may include synthetic graphite that is adhesively attached to a base component, e.g., with a pressure sensitive adhesive (PSA). The PSA may be electrically conductive and/or thermally conductive. Alternative embodiments may include other suitable heat spreaders, other adhesives, and/or other means for attaching a heat spreader to a base component. Example heat spreaders include synthetic graphite, natural graphite, other forms of pressed graphite or graphite fiber composites, graphene, graphene paper, CVD (chemical vapor deposition) diamond, CVD ceramics (e.g., aluminum nitride, aluminum silicon carbide (AlSiC), silicon carbide (SiC), etc.), higher thermal conductivity metal foils (e.g., copper, copper-molybdenum, high purity aluminum foil, etc.), ultra-thin heat pipes and vapor chambers, etc.

By way of example only, the heat spreader 52 may comprise graphite that is about 25 microns thick, the PSA may be about 5 to 10 microns thick, and the dielectric layer 56 may be about 5 microns thick. In addition, the base component 24, heat spreader 52, and the dielectric layer 56 may each have a rectangular shape or other suitable non-rectangular shape. Other exemplary embodiments may be configured differently, such as being made of different materials, having different shapes, and/or having different thicknesses. The materials and dimensions provided herein are for purposes of illustration only, as the base components, heat spreaders, EMI shielding, and TIM disclosed herein may be made from various materials and/or have various dimensions depending, for example, on the particular application, such as the electrical components to be shielded, space considerations within the overall electronic device, EMI shielding and heat dissipation needs, and other factors.

One or more TIMs 42 (e.g., compliant or conformable thermal interface pad, putty, or gap filler, etc.) may be disposed (e.g., adhesively attached via a pressure sensitive adhesive (PSA) tape, etc.) on or along one or more surfaces (e.g., on the heat spreader 52 in area(s) 54, on a cover 60 and/or walls 58 of EMI shielding, etc.). A wide range of thermal interface materials may be used in exemplary embodiments for the one or more TIMs 42, such as thermal gap fillers, thermal phase change materials, thermally-conductive EMI absorbers or hybrid thermal/EMI absorbers, thermal greases, thermal pastes, thermal putties, dispensable thermal interface materials, thermal pads, etc.

Example embodiments may include one or more thermal interface materials of Laird, such as any one or more of the Tputty™ series thermal gap fillers (e.g., Tputty™ 403, 504, 506, or 508 dispensable thermal interface materials, etc.), Tflex™ series gap fillers (e.g., Tflex™ 300 series thermal gap filler materials, Tflex™ 600 series thermal gap filler materials, Tflex™ 700 series thermal gap filler materials, etc.), Tpcm™ series thermal phase change materials (e.g., Tpcm™ 580 series phase change materials, etc.), Tpli™ series gap fillers (e.g., Tpli™ 200 series gap fillers, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), etc.

By way of further example, the thermal interface material may comprise a conformable and/or flowable thermal interface material having sufficient compressibility, flexibility, deformability, and/or flowability to allow the thermal interface material to relatively closely conform to the size and outer shape of a heat dissipating device or heat removal structure, thereby removing air gaps therebetween. The TIM may also be a form-in-place material such that it can be dispensed in place onto a complementary component.

A TIM may include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. A TIM may be configured to have sufficient conformability, compliability, and/or softness to allow the TIM material to closely conform to a mating surface when placed in contact with the mating surface, including a non-flat, curved, or uneven mating surface. A TIM may comprise an electrically conductive soft thermal interface material formed from elastomer and at least one thermally-conductive metal, boron nitride, and/or ceramic filler, such that the soft thermal interface material is conformable even without undergoing a phase change or reflow. The TIM may be a non-metal, non-phase change material that does not include metal and that is conformable even without undergoing a phase change or reflow. A TIM may comprise a thermal interface phase change material.

A TIM may comprise one or more conformable thermal interface material gap filler pads having sufficient deformability, compliance, conformability, compressibility, flowability, and/or flexibility for allowing a pad to relatively closely conform (e.g., in a relatively close fitting and encapsulating manner, etc.) to the size and outer shape of another component. Also, the thermal interface material gap filler pad may be a non-phase change material and/or be configured to adjust for tolerance or gap by deflecting.

In some exemplary embodiments, the thermal interface material may comprise a non-phase change gap filler, gap pad, or putty that is conformable without having to melt or undergo a phase change. The thermal interface material may be able to adjust for tolerance or gaps by deflecting at low temperatures (e.g., room temperature of 20° C. to 25° C., etc.). The thermal interface material may have a Young's modulus and Hardness Shore value considerably lower than copper or aluminum. The thermal interface material may also have greater percent deflection versus pressure than copper or aluminum.

In some exemplary embodiments, the thermal interface material comprises T-flex™ 300 ceramic filled silicone elastomer gap filler or T-flex™ 600 boron nitride filled silicone elastomer gap filler, which both have a Young's modulus of about 0.000689 gigapascals. Accordingly, exemplary embodiments may include thermal interface materials having a Young's module much less than 1 gigapascal. T-flex™ 300 ceramic filled silicone elastomer gap filler and T-flex™ 600 boron nitride filled silicone elastomer gap filler have a Shore 00 hardness value (per the ASTMD2240 test method) of about 27 and 25, respectively. In some other exemplary embodiments, the thermal interface material may comprise T-pli™ 200 boron nitride filled, silicone elastomer, fiberglass reinforced gap filler having a Shore 00 hardness of about 70 or 75. Accordingly, exemplary embodiments may include thermal interface materials having a Shore 00 hardness less than 100. T-flex™ 300 series thermal gap filler materials generally include, e.g., ceramic filled silicone elastomer which will deflect to over 50% at pressures of 50 pounds per square inch and other properties shown below. T-flex™ 600 series thermal gap filler materials generally include boron nitride filled silicone elastomer, which recover to over 90% of their original thickness after compression under low pressure (e.g., 10 to 100 pounds per square inch, etc.), have a hardness of 25 Shore 00 or 40 Shore 00 per ASTM D2240. Tpli™ 200 series gap fillers generally include reinforced boron nitride filled silicone elastomer, have a hardness of 75 Shore 00 or 70 Shore 00 per ASTM D2240. Tpcm™ 580 series phase change materials are generally non-reinforced films having a phase change softening temperature of about 122 degrees Fahrenheit (50 degrees Celsius). Tgrease™ 880 series thermal grease is generally a silicone-based thermal grease having a viscosity of less than 1,500,000 centipoises. Other exemplary embodiments may include a TIM with a hardness of less 25 Shore 00, greater than 75 Shore 00, between 25 and 75 Shore 00, etc.

Exemplary embodiments may include one or more thermal interface materials having a high thermal conductivity (e.g., 1 W/mK (watts per meter per Kelvin), 1.1 W/mK, 1.2 W/mK, 2.8 W/mK, 3 W/mK, 3.1 W/mK, 3.8 W/mK, 4 W/mK, 4.7 W/mK, 5 W/mK, 5.4 W/mK, 6 W/mK, 8 W/mK, etc.) depending on the particular materials used to make the thermal interface material and loading percentage of the thermally conductive filler, if any. These thermal conductivities are only examples as other embodiments may include a thermal interface material with a thermal conductivity higher than 8 W/mK, less than 1 W/mK, or other values between 1 and 8 W/mk. Accordingly, aspects of the present disclosure should not be limited to use with any particular thermal interface material as exemplary embodiments may include a wide range of thermal interface materials.

Also disclosed are exemplary embodiments of methods relating to electronic devices that include circuit boards and/or methods relating to multifunctional and/or complementary components for electronic devices. In an exemplary embodiment, a method generally includes disposing a heat spreader on a surface of a base component, such as a case (e.g., back cover, etc.), an inner plate (e.g., a mid-plate, a screenplate, etc.). In some embodiments, dielectric may be provided along and/or over an outward-facing exposed surface of the heat spreader, so as to leave one or more area(s) of the heat spreader exposed. The exposed area(s) correspond in mirror image relation to one or more electronic component(s) of a circuit board. The method may also include disposing TIM and wall(s) of EMI shielding on the exposed area(s) of the heat spreader to provide a multifunctional and/or complementary component. The complementary component is joined with the circuit board to position electronic component(s) of the circuit board in the area(s). In various embodiments, the multifunctional and/or complementary component may be joined with the circuit board without soldering. During operation of the electronic device, the multifunctional and/or complementary component may draw waste heat from one area and transfer/spread the waste heat to one or more other areas of the electronic device, which may heat and increase the temperature of these one or more other areas. This, in turn, may make device temperature more uniform and allow heat to be dissipated more uniformly.

In another exemplary embodiment, a method generally includes transferring heat from a heat source of an electronic device to another part of the electronic device using a multifunctional and/or complementary component. This heat transfer may heat and increase the temperature of the another part of the electronic device, which, in turn, may make device temperature more uniform and allow heat to be dissipated more uniformly. The multifunctional and/or complementary component may include a base component, such as a case (e.g., back cover, etc.) or an inner plate (e.g., a mid-plate, a screenplate, etc.) of the electronic device. The base component may include a heat spreader and one or more thermal interface materials. The multifunctional and/or complementary component may be used to transfer heat from the heat source to a portion of a printed circuit board, an electronic component, etc.

Exemplary embodiments may use all of the less hot components, devices, or portions of a system as heat sinks or heat absorbing members so that the heat is not just pushed up and out of the system. Instead, the heat is purposely transferred or put back into the less hot components, devices, or portions of the system at the same time heat is being taken out of the system, thereby making the overall system warmer but more uniform in temperature. This also helps keep the hottest components, devices, or portions of the system cooler as a result of moving the heat not only out of the system but into the cooler parts of the system.

Exemplary embodiments disclosed herein may have one or more (but not necessarily any or all) of the following features as compared to existing smart phones and/or other electronic devices. For example, some exemplary embodiments disclosed herein may allow for improved thermal and EMI management of electronic devices, including improved management of transient needs of mobile electronics. In some embodiments, benefits may include reduced weight and elimination of some process steps such as solder reflow when a device is being assembled. In various embodiments, a heat spreader may use other components as heat sinks, making it possible to obtain more uniform device temperature, to use higher powered processors, and to more capably manage transient events. By combining multiple components (e.g., inner plate, mid-plate, screenplate, case, back cover, EMI shielding, TIM, heat spreader, etc.) into one component, the total part count can be reduced and manufacturing logistics can be improved.

Example embodiments may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purposes of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A multifunctional component for an electronic device, the multifunctional component comprising:
    a base component;
    a heat spreader disposed on the base component; and
    a thermal interface material and one or more walls of electromagnetic interference shielding material disposed on one or more areas of the heat spreader;
    the one or more areas corresponding in mirror image relation to one or more components of a circuit board for which the multifunctional component is configured to be joined;
wherein:
    the heat spreader comprises graphite laminated to the base component; and
    the one or more walls comprise flexible fabric shielding material.

2. The multifunctional component of claim 1, wherein the graphite comprises a graphite sheet.

3. The multifunctional component of claim 1, wherein the base component comprises a base component of the electronic device having an original functionality, wherein the multifunctional component retains the original functionality of the base component, and wherein the heat spreader, the thermal interface material, and the one or more walls of electromagnetic interference shielding material provide additional functionality for providing EMI shielding and thermal management for the circuit board.

4. The multifunctional component of claim 1, wherein:
    the thermal interface material comprises a thermally-conductive EMI absorber; and/or
    the multifunctional component further comprises an EMI absorber disposed on the heat spreader and/or on the base component.

5. The multifunctional component of claim 2, wherein the base component comprises a case, an inner plate, a back cover, a mid-plate, and/or a screenplate of the electronic device to which the graphite sheet is attached.

6. The multifunctional component of claim 1, further comprising a dielectric layer disposed on one or more portions of the heat spreader outside the one or more areas.

7. The multifunctional component of claim 6, wherein the dielectric layer is printed and/or laminated on the heat spreader.

8. The multifunctional component of claim 1, wherein the one or more areas comprise a plurality of areas each configured to allow heat from a corresponding component of the circuit board to spread through the heat spreader to another one or more of the areas, whereby the multifunctional component is operable for transferring heat from one or more hotter components of the circuit board to one or more cooler components of the circuit board to thereby increase temperature of the one or more cooler components while decreasing temperature of the one or more hotter components and thereby make device temperature more uniform.

9. The multifunctional component of claim 1, wherein at least some of the thermal interface material is at least partly surrounded by one or more of the one or more walls in one of the one or more areas of the heat spreader and/or is disposed on a shielding cover disposed on the one of the one or more areas of the heat spreader.

10. An electronic device comprising the circuit board having the one or more components and the multifunctional component of claim 1, wherein the multifunctional component is joined with the circuit board such that a thermally-conductive heat path is defined from the one or more components of the circuit board through the thermal interface material to the heat spreader and such that the one or more walls provide electromagnetic interference shielding for the one or more components of the circuit board.

11. The multifunctional component of claim 1, wherein the base component comprises a case, a back cover, a mid-plate, a screenplate, and/or an inner plate of a smart phone.

12. The multifunctional component of claim 1, wherein the multifunctional component is configured to be operable for transferring heat from a heat source of the electronic device to another part of the electronic device using the multifunctional component, whereby the heat transfer increases a temperature of the another part of the electronic device thereby making device temperature more uniform.

13. The multifunctional component of claim 1, wherein the multifunctional component is configured to be operable for transferring heat from one or more hotter electronic components of the electronic device to one or more cooler electronic components of the electronic device, to thereby increase temperature of the one or more cooler electronic components while decreasing temperature of the one or more hotter electronic components and thereby make device temperature more uniform.

14. The multifunctional component of claim 2, wherein the multifunctional component is configured to be operable for transferring heat from a heat source of the electronic device to another part of the electronic device using the multifunctional component, whereby the heat transfer increases a temperature of the another part of the electronic device thereby making device temperature more uniform.

15. The multifunctional component of claim 1, wherein the base component comprises a case, a back cover, a mid-plate, a screenplate, an inner plate of a smart phone, and/or the thermal interface material.

\* \* \* \* \*